US009648671B2

(12) United States Patent
Oyamada et al.

(10) Patent No.: US 9,648,671 B2
(45) Date of Patent: May 9, 2017

(54) LIGHTING DEVICE

(71) Applicants: CITIZEN ELECTRONICS CO., LTD., Yamanashi-ken (JP); CITIZEN WATCH CO., LTD., Tokyo (JP)

(72) Inventors: Nodoka Oyamada, Yamanashi-ken (JP); Kenji Imazu, Saitama-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 126 days.

(21) Appl. No.: 14/458,580

(22) Filed: Aug. 13, 2014

(65) Prior Publication Data
US 2015/0049481 A1 Feb. 19, 2015

(30) Foreign Application Priority Data
Aug. 16, 2013 (JP) .................. 2013-169209

(51) Int. Cl.
*H01L 33/50* (2010.01)
*H05B 33/06* (2006.01)
*F21K 9/23* (2016.01)

(52) U.S. Cl.
CPC ........... *H05B 33/06* (2013.01); *H01L 33/508* (2013.01); *F21K 9/23* (2016.08)

(58) Field of Classification Search
CPC ........... H01L 33/56; H01L 2224/45144; H01L 2224/48247; H01L 2224/73265; H01L 2224/32245; H01L 2924/00; H01L 33/508; H01L 33/502; H05B 33/06; H05B 33/12; F21K 9/13; F21K 9/56; F21K 9/23
See application file for complete search history.

(56) References Cited

U.S. PATENT DOCUMENTS

| | | | | |
|---|---|---|---|---|
| 2003/0230757 A1* | 12/2003 | Suehiro | ................. | H01L 33/508 257/99 |
| 2004/0169451 A1* | 9/2004 | Oishi | ...................... | H01L 33/64 313/45 |
| 2005/0173708 A1* | 8/2005 | Suehiro | .................. | H01L 33/56 257/79 |

(Continued)

FOREIGN PATENT DOCUMENTS

| | | |
|---|---|---|
| JP | 2002-319705 | 10/2002 |
| JP | 2007-019096 | 1/2007 |

(Continued)

*Primary Examiner* — Andrew Coughlin
*Assistant Examiner* — Fatima Farokhrooz
(74) *Attorney, Agent, or Firm* — Wenderoth, Lind & Ponack, L.L.P.

(57) ABSTRACT

In a first aspect of the present inventive subject matter, a lighting device includes a light-emitting device 1 including p-contact and n-contact that are separately arranged from each other on a first surface of the light-emitting element and a phosphor layer including a phosphor particle and covering the light-emitting element 1 except the p-contact and n-contact of the light-emitting element, the phosphor layer includes a higher density of the phosphor particle on a position of the first surface between the p-contact and the n-contact of the light-emitting element than on a position of a second surface that is an opposite surface of the first surface 1b of the light-emitting element.

13 Claims, 13 Drawing Sheets

(56) References Cited

U.S. PATENT DOCUMENTS

| | | | | |
|---|---|---|---|---|
| 2007/0259206 A1* | 11/2007 | Oshio | ................... | C04B 35/581 |
| | | | | 428/690 |
| 2012/0326193 A1* | 12/2012 | Park | ....................... | H01L 33/52 |
| | | | | 257/98 |
| 2013/0069525 A1* | 3/2013 | Imai | ....................... | H01L 24/97 |
| | | | | 313/512 |
| 2013/0099264 A1* | 4/2013 | Zimmerman | ........... | H01L 33/64 |
| | | | | 257/89 |
| 2014/0070714 A1* | 3/2014 | Lee | ................... | H05B 33/0818 |
| | | | | 315/186 |

FOREIGN PATENT DOCUMENTS

| | | |
|---|---|---|
| JP | 2007-103505 | 4/2007 |
| JP | 2010-192629 | 9/2010 |

* cited by examiner

LIGHTING DEVICE

CROSS-REFERENCE TO RELATED APPLICATION

This application is a new U.S. patent application that claims benefit of JP2013-169209, filed on Aug. 16, 2013, the disclosure of which is incorporated herein by reference in its entirety.

BACKGROUND OF THE INVENTION

Field of the Invention

The present invention relates to a lighting device including a light-emitting device or a light-emitting element that is mounted on a circuit substrate, and also relates to a lighting device including a light-emitting device to be mounted on a substrate.

Description of the Related Art

It is laid open to the public that a lighting device including a case with an opening, an LED element arranged in the opening of the case and including a layered body that includes a light-emitting layer, and a coating member filled in the opening of the case and sealing the LED element except a light-emitting surface of the LED element. The coating member includes a light-reflectance particle. For reference, see Japanese Unexamined Patent Application Publication No. 2007-19096).

Also, it is laid open to the public that a method manufacturing a lighting device. The method including a first step mounting a light-emitting element on a substrate, a second step covering a peripheral surface of the light-emitting element by a first light-reflecting member such that an upper surface of the light-emitting element is exposed from the first light-reflecting member, a third step applying an adhesive on the upper surface of the light-emitting element to adhere a light-transmitting member to the upper surface of the light-emitting element, and a fourth step covering a peripheral surface of the light-transmitting member by a second light-reflecting member such that an upper surface of the light-transmitting member is exposed from the light-transmitting member (For reference, see Japanese Unexamined Patent Application Publication No. 2010-192629).

It is laid open to the public that a light-emitting device includes a mounting substrate and a light a light-emitting diode chip that includes a surface with p-side electrode and n-side electrode. The surface with p-side electrode and n-side electrode of the light-emitting diode chip is mounted on electrodes of the substrate. It is also disclosed that a filler of Ag paste or solder is filled as a light-reflection portion between the light-emitting diode chip and the substrate (For reference, see Japanese Unexamined Patent Application Publication No. 2002-319705).

Also, it is laid open to the public that a light-emitting device includes a laminated chip varistor, a semiconductor light-emitting element arranged on the laminated chip varistor, and a light-reflecting layer arranged between the semiconductor light-emitting element and the laminated chip varistor to reflect light from the semiconductor light-emitting element (For reference, see Japanese Unexamined Patent application Publication No. 2007-103505).

SUMMARY OF THE INVENTION

In a first aspect of the present inventive subject matter, a lighting device includes a light-emitting device that includes a light-emitting element with a p-contact and n-contact separately arranged from each other on a first surface of the light-emitting element; and a phosphor layer that including a phosphor particle and covering the light-emitting element except the p-contact and n-contact of the light-emitting element, and the phosphor layer includes a higher density of the phosphor particle on a position of the first surface between the p-contact and the n-contact of the light-emitting element than on a position of a second surface that is an opposite surface of the first surface of the light-emitting element.

In a second aspect of the present inventive subject matter, a lighting device includes a light-emitting device that includes a light-emitting element with a p-contact and a n-contact that are separately arranged from each other on a first surface of the light-emitting element and a first phosphor layer including a phosphor particle and covering the light-emitting element except the p-contact and n-contact of the light-emitting element; a circuit substrate including an anode electrode and a cathode electrode that are separately arranged from each other on a surface of the circuit substrate with a space between the anode electrode and the cathode electrode; and a second phosphor layer including a phosphor particle and arranged in the space between the anode electrode and the cathode electrode of the circuit substrate, and the first surface with the p-contact and the n-contact of the light-emitting element of the light-emitting device is electrically mounted on the anode electrode and the cathode electrode of the circuit substrate.

It is also disclosed that the lighting device further includes a circuit substrate that includes an anode electrode and a cathode electrode separately arranged from each other on a surface of the circuit substrate with a space between the anode electrode and the cathode electrode; and a second phosphor layer including the phosphor particle and arranged in the space between the anode electrode and the cathode electrode of the circuit substrate while the phosphor layer covering the light-emitting element except the p-contact and n-contact of the light-emitting element is defined as a first phosphor layer, and the first surface with the p-contact and the n-contact of the light-emitting element of the light-emitting device is electrically mounted on the anode electrode and the cathode electrode of the circuit substrate.

In a third aspect of the present inventive subject matter, a lighting device includes a circuit substrate that includes anode electrode and a cathode electrode that are separately arranged from each other on an upper surface of the circuit substrate with a space between the anode electrode and the cathode electrode; a light-emitting element that includes a p-contact and n-contact that are separately arranged from each other on a first surface of the light-emitting element, and the light-emitting element that is electrically mounted on the anode electrode and the cathode electrode of the circuit substrate; a first phosphor layer including a phosphor particle and being arranged over the upper surface of the circuit substrate to seal the light-emitting element that is electrically mounted on the anode electrode and the cathode electrode of the circuit substrate; and a second phosphor layer including the phosphor particle and filled in the space between the anode electrode and the cathode electrode of the circuit substrate, the second phosphor layer includes a higher density of the phosphor particle than the first phosphor layer on a position of the first surface between the p-contact and the n-contact of the light-emitting element.

It is disclosed that the first phosphor layer and the second phosphor layer may include a same density of the phosphor particle.

It is also disclosed that the second phosphor layer may include a higher density of the phosphor particle than the first phosphor layer.

Furthermore, it is disclosed that the light-emitting element includes at least one blue light-emitting element, at least one near ultraviolet light-emitting element, and/or at least one ultraviolet light-emitting element.

Also, it is disclosed that the light-emitting element is configured to emit a first emission of light within a first light emission spectrum range when current is applied to the light-emitting element, and the phosphor is configured to emit a second emission of light in response to the first emission, and the second emission is within a second light emission spectrum range that is a longer wavelength light emission spectrum range than the first light emission spectrum range.

It is also disclosed that the anode electrode and the cathode electrode have a thickness greater than a maximum particle diameter of the phosphor particle contained in the second phosphor layer.

In an aspect of the present inventive subject matter, a method manufacturing a lighting device includes arranging a phosphor layer containing a phosphor on a surface of a substrate except an area where an anode electrode and a cathode electrode are provided, and electrically mounting light-emitting devices on the anode electrode and the cathode electrode of the substrate such that lower surfaces of the light-emitting devices face the positions of the phosphor layer arranged between the anode electrode and the cathode electrode arranged on the surface of the circuit substrate.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, elements, components, portion of an element, and/or groups but do not preclude the presence or addition of one or more other features, integers, elements, components, portions, and/or groups thereof.

Relative terms such as "below" or "above" or "upper" or "lower" or "upward" or "downward" or "left" or "right" may be used herein to describe a relationship of one element, portion, surface, area, or direction to another element, portion, surface, area, or direction as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature.

Figure 1:
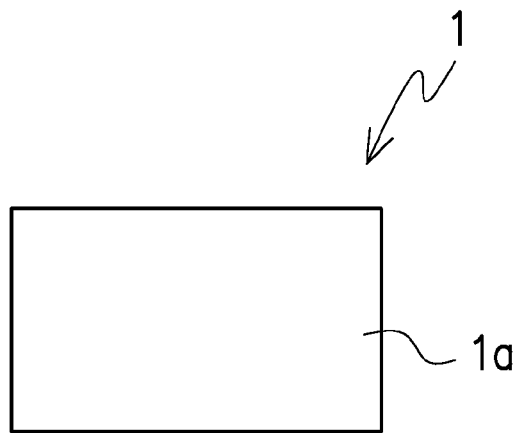
FIG. 1 is a schematic top plan view of a light-emitting element included in a lighting device, according to an embodiment of the present invention.
Figure 2:
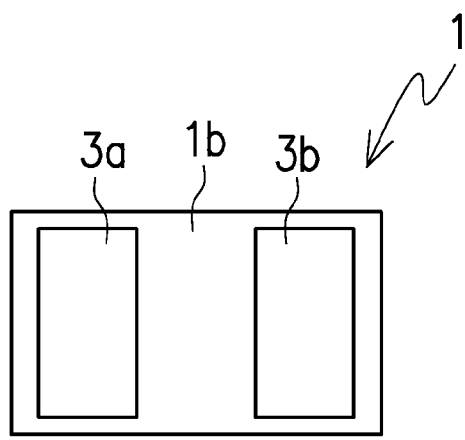
FIG. 2 is a schematic bottom plan view of a light-emitting element including in a lighting device, according to an embodiment of the present invention.

FIG. 1 is a schematic top plan view of a light-emitting element included in a lighting device, according to an embodiment of the present invention. FIG. 2 is a schematic bottom plan view of a light-emitting element including in a lighting device, according to an embodiment of the present invention.

The light-emitting element 1 may be a light-emitting diode (LED) element including p-contact electrode 3a and n-contact electrode 3b positioned at a first surface 1b, which is a lower surface of the light-emitting element 1. The light-emitting element 1 may be a bare chip. The bare chip may be a wafer-level chip. The p-contact electrode 3a and the n-contact electrode 3b positioned adjacent to the lower surface 1b of the light-emitting element 1 may be electrically connected to a substrate and/or motherboard (that is not shown in FIG. 1 and FIG. 2) through an electrically conductive material such as bumps and/or solder. For more details, the electrically conductive material may be metal paste, soldering paste, and/or electrically conductive adhesive.

Figure 4:
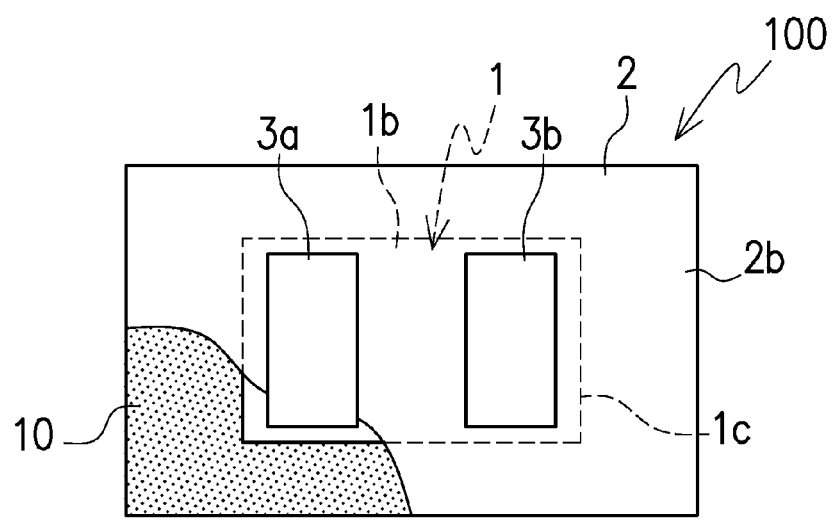
FIG. 4 is a schematic bottom plan view of light-emitting device included in a lighting device according to the first embodiment with a partially sectional view at a corner of the bottom plan view of the light-emitting device.

The light-emitting element 1 includes a p-contact (anode contact) 3a and a n-contact (cathode contact) 3b that are arranged on a first surface 1b of the light-emitting element 1. The shapes of the p-contact 3a and the n-contact 3b are shown in FIG. 4 as rectangular shapes similar to each other, but not limited to the shapes shown in FIG. 4. Also, the p-contact 3a and the n-contact 3b are shown similar to each other in size and/or shape in FIG. 4, but not limited to the sizes and/or shapes shown in Figures. The p-contact 3a may be smaller in size than the n-contact 3b. The p-contact 3a and the n-contact 3b of the light-emitting element 1 are separately arranged from each other at a first surface 1b of the light-emitting element 1.

Figure 3:
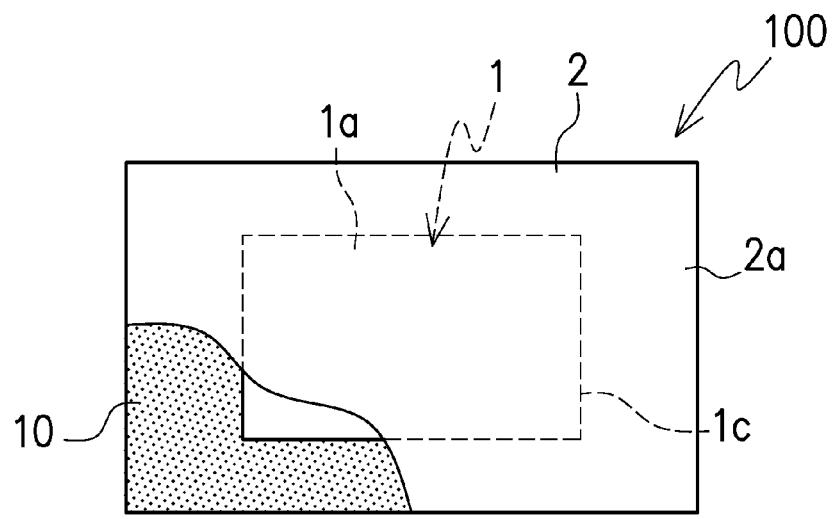
FIG. 3 is a schematic top plan view of light-emitting device included in a lighting device according to the first embodiment with a partially sectional view at a corner of the top plan view of the light-emitting device.

FIG. 3 is a schematic top plan view of lighting device according to the first embodiment with a partially sectional view at a corner of the top plan view of the lighting device. The sectional view at the corner shows a phosphor particle 10 contained in a phosphor layer 2. FIG. 4 is a schematic bottom plan view of lighting device according to the first embodiment with a partially sectional view at a corner of the bottom plan view of the lighting device. The phosphor layer 2 may include a sealant and a phosphor mixed in the sealant. The sealant may be made of silicone resin, epoxy resin, and/or glass material.

Figure 5:
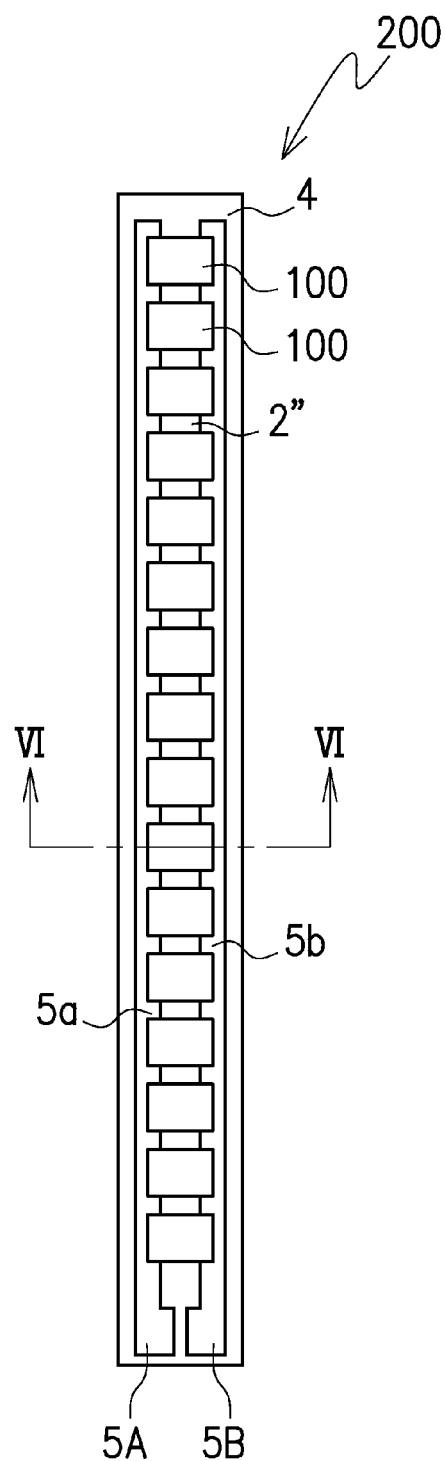
FIG. 5 is a top plan view of lighting device, according to a second embodiment of the present invention.

A lighting device 200 includes a light-emitting device 100 as shown in FIG. 5.

As shown in FIGS. 3 and 4, the light-emitting device 100 includes a light-emitting element 1 that includes a p-contact (anode) 3a and n-contact (cathode) 3b separately arranged from each other on a first surface 1b of the light-emitting element 1, and a phosphor layer 2 including a phosphor particle 10 and covering the light-emitting element 1 except the p-contact 3a and n-contact 3b of the light-emitting element 1. In this embodiment, the phosphor layer 2 includes a higher density of the phosphor particle on a position of the first surface 1b between the p-contact 3a and the n-contact 3b of the light-emitting element 1 than on a position of a second surface 1a that is an opposite surface of the first surface 1b of the light-emitting element 1. In this embodiment, it is possible to dispense the phosphor layer 2 on the first surface 1b, the second surface 1a, and the peripheral side surface 1c by coating, painting, or molding, for example.

In other words, the phosphor layer 2 covers the first surface 1b, the second surface 1a except the p-contact 3a and the n-contact 3b, and a peripheral side surface 2c. In this embodiment, the peripheral side surface 2c includes four side surfaces between peripheral edges of the first surface 1b and the second surface 1a of the light-emitting element 1.

Figure 6:
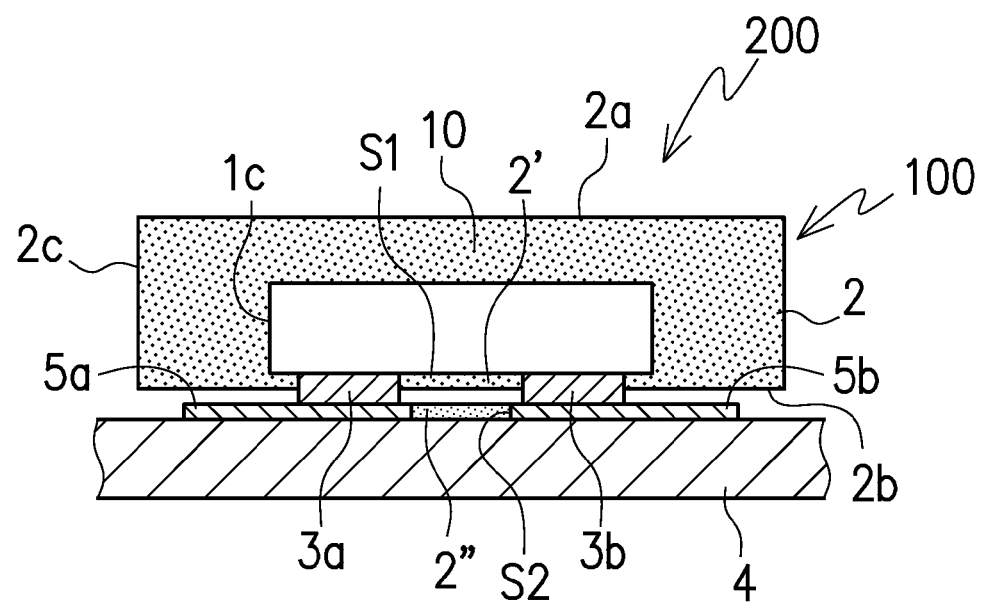
FIG. 6 is a cross-sectional view of lighting device taken along a line VI-VI shown in FIG. 5.

As shown in FIGS. 5 and 6, the lighting device 200 further includes a circuit substrate 4. The circuit substrate 4 includes an anode electrode 5a and a cathode electrode 5b that are separately arranged from each other on a surface of the circuit substrate 4. There is a space between the anode electrode 5a and the cathode electrode 5b. The lighting device 200 further includes a second phosphor layer 2" including the phosphor particle 10 and arranged in the space between the anode electrode 5a and the cathode electrode 5b of the circuit substrate 4. The first surface 1b with the p-contact 3a and the n-contact 3b of the light-emitting element 1 of the light-emitting device 100 is electrically mounted on the anode electrode 5a and the cathode electrode 5b of the circuit substrate 4.

The second phosphor layer 2" that is arranged on the circuit substrate 4 may be located under the first surface 1b of the light-emitting element 1. The second phosphor layer 2" may include a higher density of the phosphor particle than the first phosphor layer 2 on the position of the second surface 1a that is the opposite surface of the first surface 1b of the light-emitting element 1.

Also, the second phosphor layer 2" may be entirely arranged on the surface of the circuit substrate except the anode electrode 5a and the cathode electrode 5b, as shown in FIGS. 17-21.

The p-contact 3a of the light-emitting element 1 and the anode electrode 5a of the circuit substrate 4 may be electrically connected through an electrically conductive paste arranged between the p-contact 3a and the anode electrode 5a. Also, the n-contact 3b of the light-emitting element 1 and the cathode electrode 5b of the circuit substrate 4 may be electrically connected through an electrically conductive paste arranged between the n-contact 3b and the cathode electrode 5b.

FIG. 5 is a top plan view of lighting device 200, according to a second embodiment of the present invention.

A lighting device 200 includes a light-emitting device 100. The light-emitting device 100 includes a light-emitting element 1 that includes a p-contact (anode) 3a and n-contact (cathode) 3b separately arranged from each other on a first surface 1b of the light-emitting element 1 and a first phosphor layer 2 that includes a phosphor particle 10 and covers the light-emitting element 1 except the p-contact 3a and n-contact 3b of the light-emitting element 1. The lighting device 200 further includes a circuit substrate 4 that includes an anode electrode 5a and a cathode electrode 5b separately arranged from each other on a surface of the circuit substrate 4 with a space S2 between the anode electrode 5a and the cathode electrode 5b; and a second phosphor layer 2 including a phosphor particle 10 and arranged in the space S2 between the anode electrode 5a and the cathode electrode 5b of the circuit substrate 4. The first surface 1b with the p-contact 3a and the n-contact 3b of the light-emitting element 1 of the light-emitting device 100 is electrically mounted on the anode electrode 5a and the cathode electrode 5b of the circuit substrate 4.

FIG. 6 is a cross-sectional view of lighting device taken along a line VI-VI shown in FIG. 5. In this embodiment, the second phosphor layer 2" includes a higher density of the phosphor particle 10 than the first phosphor layer 2. The second phosphor layer 2" may contain a phosphor particle that is the same type as the phosphor particle contained in the first phosphor layer 2. The p-contact 3a and the n-contact 3b are required to have a thickness greater than a maximum particle diameter of the phosphor particle 10 included in the first phosphor layer 2 on a position of the first surface 1b in a space S1 between the p-contact 3a and the n-contact 3b of the light-emitting element 1. In this configuration, it is possible to arrange the phosphor particle 10 in the space S1 between the p-contact 3a and the n-contact 3b sufficiently.

As shown in FIG. 5, the lighting device 200 may include two or more light-emitting devices 100 arranged in a line. The light-emitting devices 100 may be arranged in two or more lines that are parallel with each other. Also, it is possible to arrange the light-emitting devices 100 in an array over a rectangular or square-shaped circuit substrate.

The light-emitting elements 1 are electrically mounted on an anode electrode 5a and a cathode electrode 5b that include portions extending parallel with each other.

Also, as shown in FIG. 6, because the light-emitting device 100 with the first phosphor layer 2 is mounted on the substrate 4 with the second phosphor layer 2", there may be an air layer between a lower surface 2b of the first phosphor layer 2 and an upper surface of the second phosphor layer 2". In this configuration, it is possible to manufacture the light-emitting devices 100 with the first phosphor layer 2 and the circuit substrate 4 with the second phosphor layer 2" separately, and then, later to mount the light-emitting devices 100 on the substrate 4 to be a lighting device 200. Positions of the light-emitting devices 100 are selectable on the circuit substrate 4. In an aspect of the present inventive subject matter, a method manufacturing a lighting device includes arranging a phosphor layer containing a phosphor on a surface of a circuit substrate except an area where an anode electrode and a cathode electrode are provided, and electrically mounting light-emitting devices 100 on the anode electrode and the cathode electrode of the substrate such that lower surfaces of the light-emitting devices 100 face the positions of the phosphor layer arranged between the anode electrode and the cathode electrode arranged on the surface of the substrate.

Accordingly, it is possible to sufficiently arrange the phosphor particle 10 between the anode electrode 5a and the cathode electrode 5b on the surface of the circuit substrate 4 such that direct light from the light-emitting element 1 is able to be converted by the phosphor particle 10 to be longer wavelength light, which less affects the quality of the circuit substrate.

The light-emitting element 1 may include at least one blue light-emitting element, at least one near ultraviolet light-emitting element, and/or least one ultraviolet light-emitting element.

Also, the light-emitting element 1 comprises at least one light-emitting element that belongs to a light emission spectrum range of 400 nm to 490 nm.

Furthermore, the light-emitting element 1 is configured to emit a first emission of light within a first light emission spectrum range when current is applied to the light-emitting element 1, and the phosphor particle 10 is configured to emit a second emission of light in response to the first emission, and the second emission is within a second light emission spectrum range that is a longer wavelength light emission spectrum range than the first light emission spectrum range.

The phosphor particle 10 may include a yellow phosphor. YAG (yttrium aluminum garnet) phosphor is known as a yellow phosphor. Also, the phosphor particle 10 may include a red phosphor. CASN and SCASN are known as red phosphors whose general formula is $CaAlSiN_3$,:Eu etc.

Figure 7:
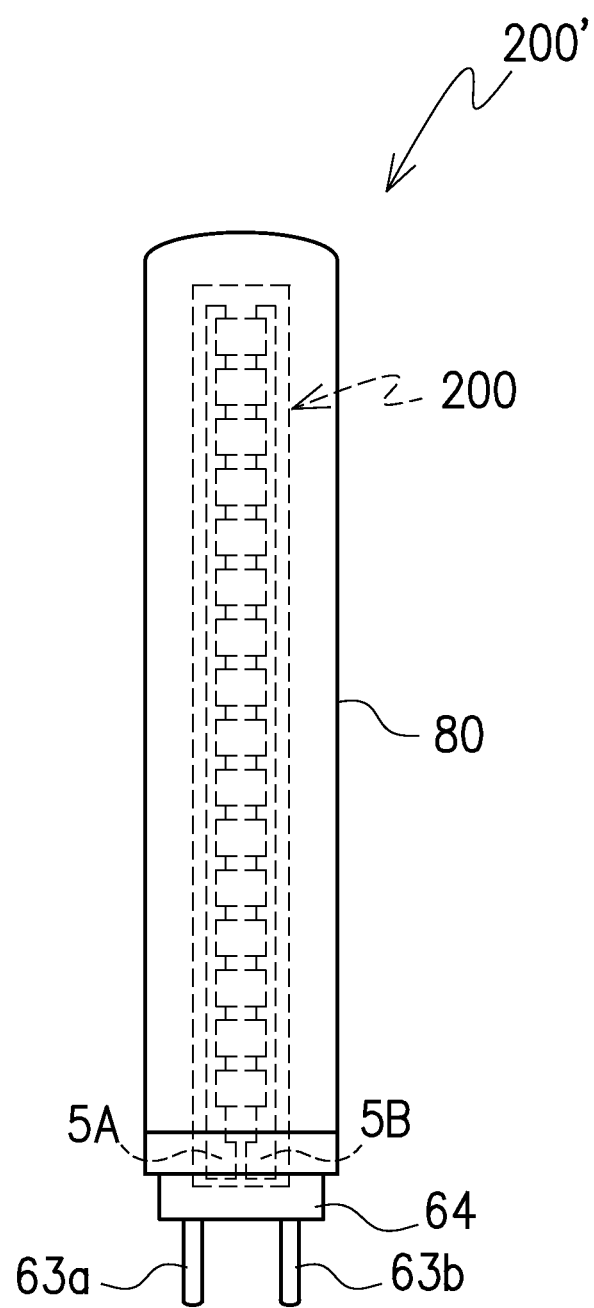
FIG. 7 is a lighting device as a lighting lamp according to an embodiment of the present invention.

FIG. 7 is a lighting device as a lighting lamp according to an embodiment of the present invention. The lighting device 200' further includes a light-transmitting cover 80 covering at least over the light-emitting elements 1. The light-transmitting cover 80 may be transparent or translucent. The light-transmitting cover 80 may be made of glass, resin, and/or plastic. The lighting device 200' further includes a holder 64 supporting the light-transmitting cover 80 and including a pair of terminals 63a and 63b, through which electricity is applied from an outside power source to anode terminal electrode 5A and cathode terminal electrode 5B. The anode terminal electrode 5A is electrically connected to the anode electrode 5a. The cathode terminal electrode 5B is electrically connected to the cathode electrode 5b.

Figure 8:
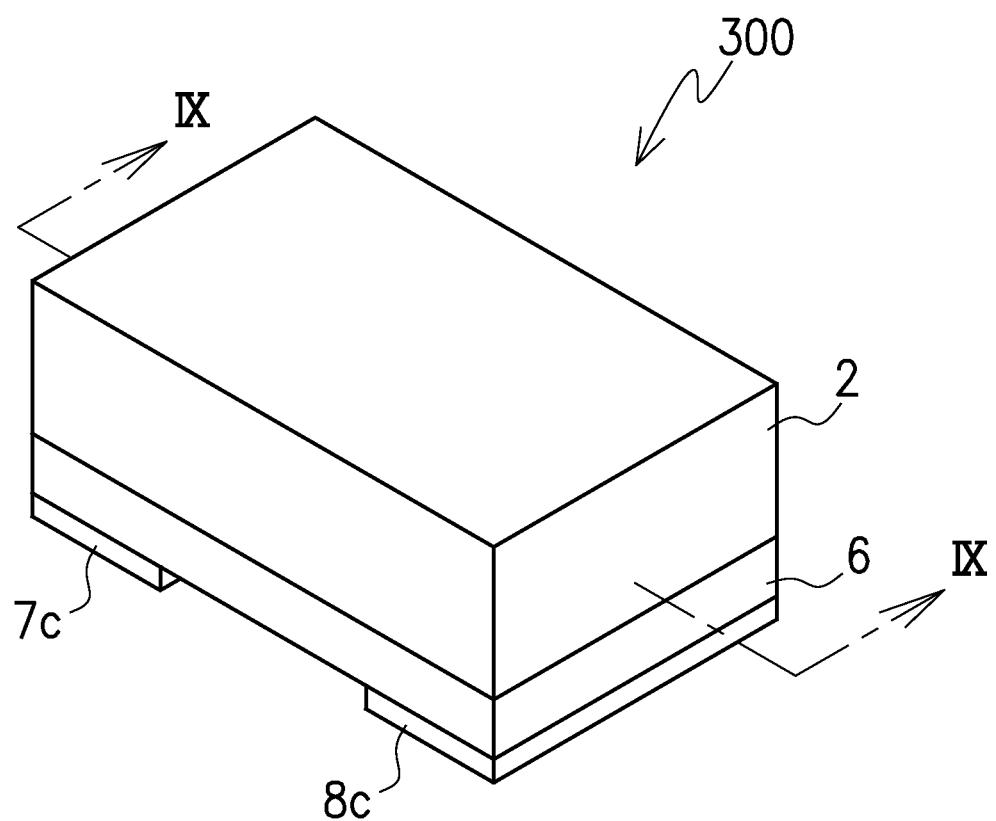
FIG. 8 is a third embodiment of the present invention.

FIG. 8 is a third embodiment of the present invention.

Figure 9:
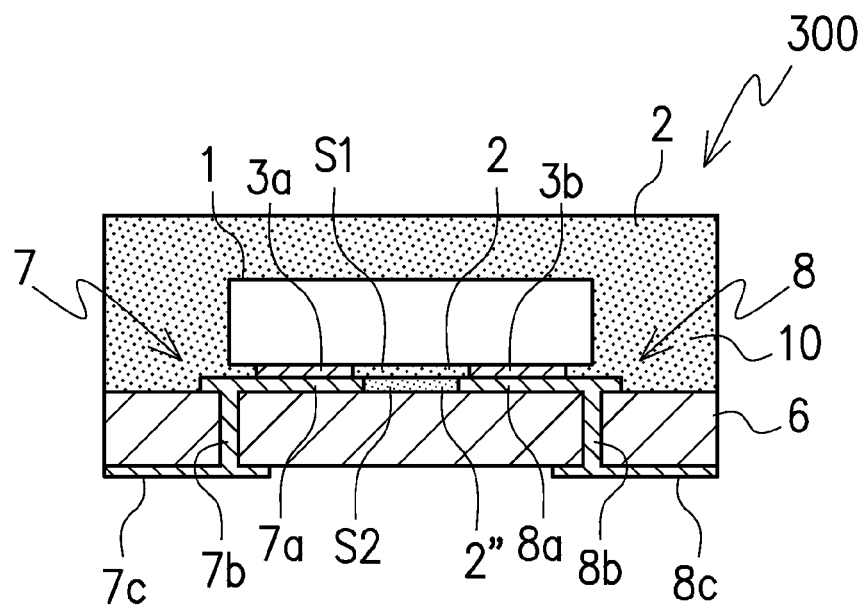
FIG. 9 is a cross-sectional view of the lighting device taken along a line XI-XI shown in FIG. 8.

FIG. 9 is a cross-sectional view of the lighting device taken along a line XI-XI shown in FIG. 8. A lighting device 300 includes a circuit substrate 6 that includes anode electrode 7a and a cathode electrode 8a separately arranged from each other on an upper surface of the circuit substrate 5 with a space S2 between the anode electrode 7a and the cathode electrode 8a; a light-emitting element 1 including a p-contact (anode) 3a and n-contact (cathode) 3b that are separately arranged from each other on a first surface 1b of the light-emitting element 1, the light-emitting element 1 electrically mounted on the anode electrode 7a and the cathode electrode 8a of the circuit substrate 6; a first phosphor layer 2 including a phosphor particle 10 and being arranged over the upper surface of the circuit substrate 6 to seal the light-emitting element 1 that is electrically mounted on the anode electrode and the cathode electrode of the circuit substrate 6; and a second phosphor layer 2" including the phosphor particle 10 and filled in the space S2 between the anode electrode 7a and the cathode electrode 7b on the upper surface of the circuit substrate 6. In this embodiment, the first phosphor layer 2 and the second phosphor layer 2" are in contact with each other without an air layer. In this embodiment, the anode electrode 7 may include an upper electrode 7a arranged on an upper surface of the substrate 6 and a lower electrode 7c arranged on a lower surface of the substrate 6. The upper electrode 7a and the lower electrode 7c of the anode electrode 7 may be electrically connected via a through-hole 7b. Also, the cathode electrode 8 may include an upper electrode 8a arranged on the upper surface of the substrate 6 and a lower electrode 8c arranged on the lower surface of the substrate 6. The upper electrode 8a and the lower electrode 8c of the cathode electrode 8 may be electrically connected via a through-hole 8b, but not be limited to the structure and shape shown in this embodiment.

In this embodiment, the first phosphor layer 2 and the second phosphor layer 2" may include a same density of phosphor particle 10. In this embodiment, because the first phosphor layer 2 and the second phosphor layer 2" are separately arranged on the light-emitting element 1 and on the circuit substrate 6, it is possible to sufficiently arrange the phosphor particle 10 under the light-emitting element 1. The same density of phosphor particle here means that it includes a difference of density of phosphor particle of manufacturing error.

Figure 10:
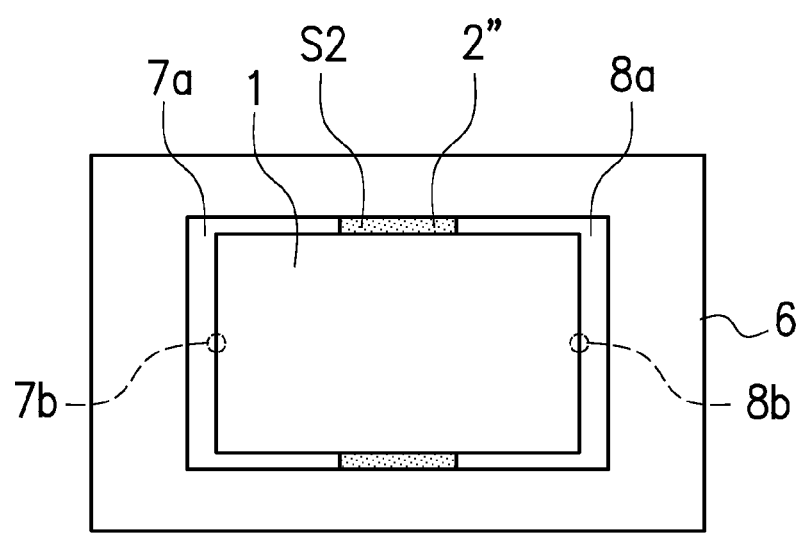
FIG. 10 shows an explanatory top plan view of lighting device with a first phosphor layer being removed from the lighting device shown in FIG. 7, for reference.

FIG. 10 shows an explanatory top plan view of lighting device with a first phosphor layer being removed from the lighting device shown in FIG. 7, for reference. Ends of the second phosphor layer 2" may appear from the light-emitting element 1 when viewed from above the circuit substrate 6.

Figure 11:
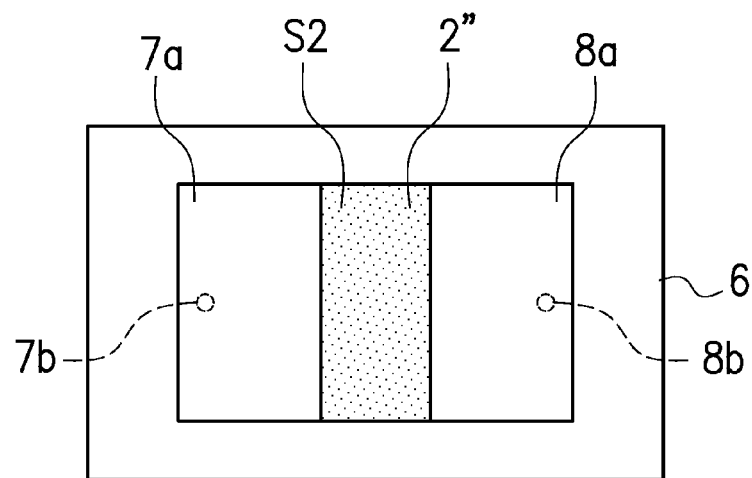
FIG. 11 shows a top plan view of a substrate used in an embodiment of a lighting device according to the third embodiment.

FIG. 11 shows a top plan view of a circuit substrate used in an embodiment of a lighting device according to the third embodiment. In this embodiment, the second phosphor layer 2" arranged in the space S2 of the circuit substrate 6 has a rectangular shape when viewed from above the circuit substrate 6.

Figure 12:
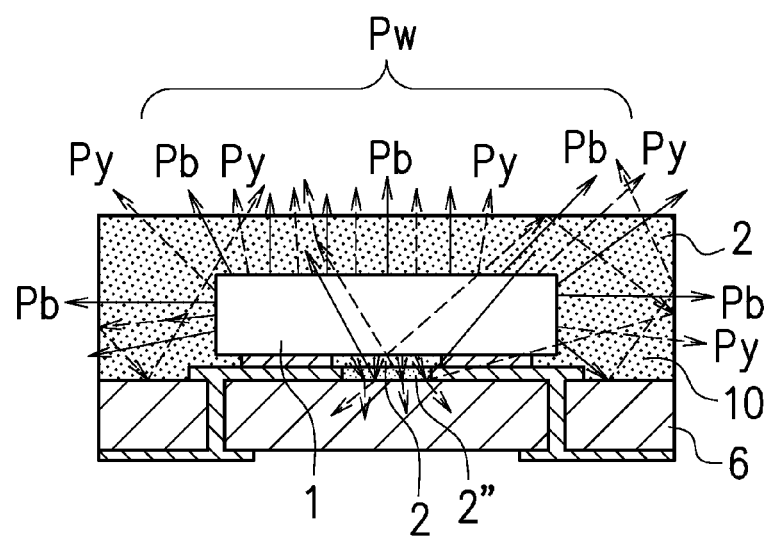
FIG. 12 shows an explanatory diagram, showing different color components of light in a cross-sectional view of a lighting device as an embodiment, when current is passed through the lighting device.

FIG. 12 shows an explanatory diagram, showing different color components of light in a cross-sectional view of a lighting device as an embodiment, when current is passed through the lighting device. Light Pb is light emitted from a light-emitting element 1. Light Py is light emitted from a phosphor particle 10 that is excited by light Pb from the light-emitting element 1. Light Pw is mixed light detected by the human eye. For example, if the light-emitting element 1 is a blue light-emitting element and the phosphor particle 10 is a YAG phosphor, blue light from the light-emitting element 1 and yellow light from the phosphor particle 10 appear to be white light in the human eye.

Figure 13:
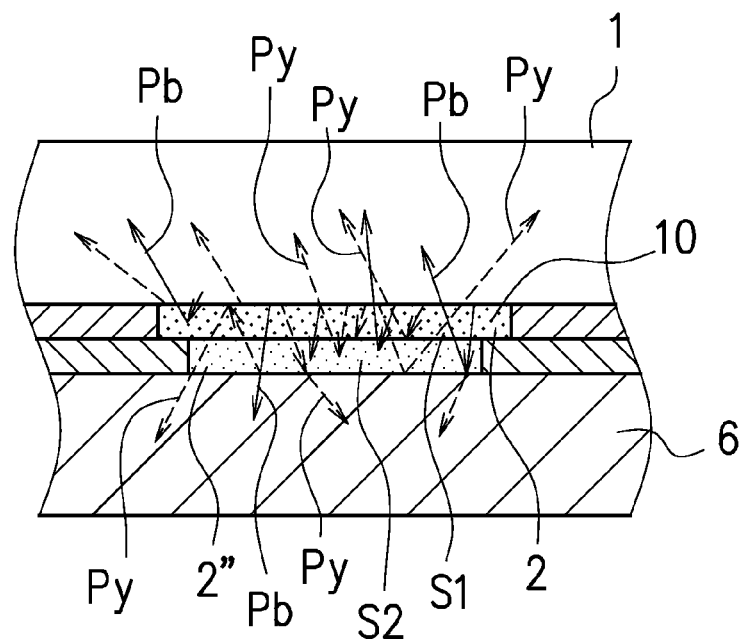
FIG. 13 is an enlarged sectional view of a portion where a light-emitting element is mounted on a substrate in FIG. 10.

FIG. 13 is an enlarged sectional view of a portion where the light-emitting element is mounted on the substrate in FIG. 12. It shows that light toward the circuit substrate 6 is a longer wavelength light py converted by the phosphor particle 10.

Figure 14:
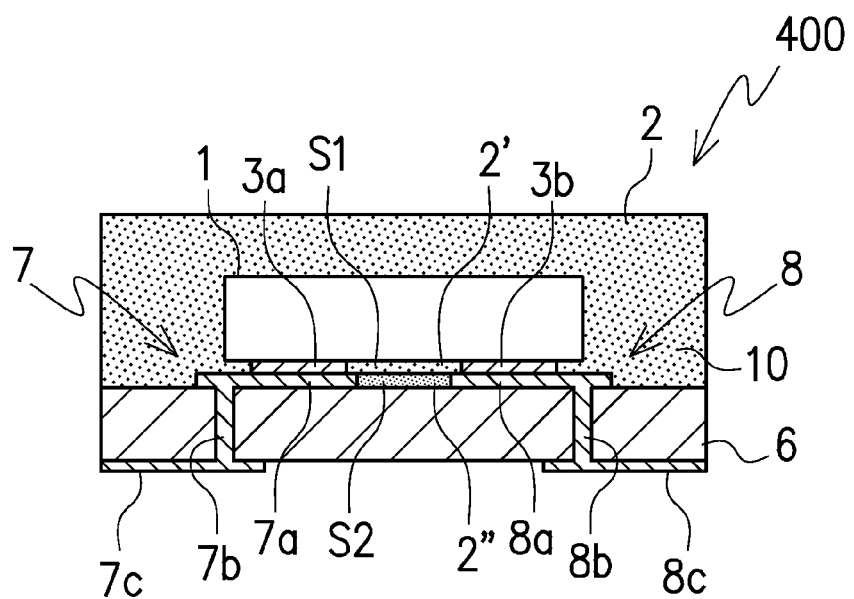
FIG. 14 is a cross-sectional view of lighting device according to a fourth embodiment.
Figure 15:
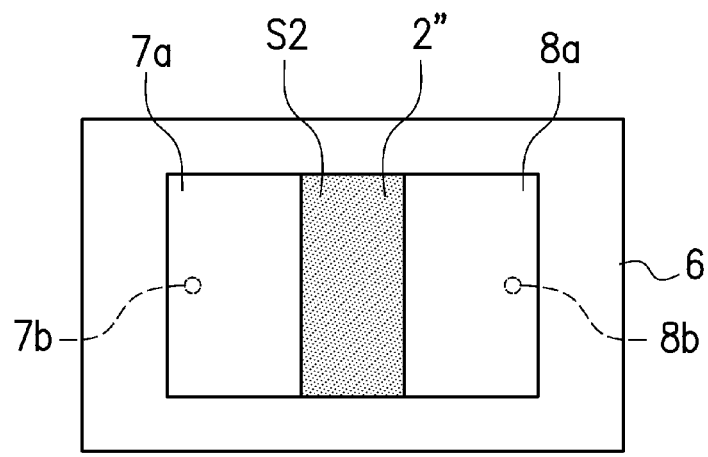
FIG. 15 shows a top plan view of a substrate used in an embodiment of a lighting device according to the fourth embodiment.
Figure 16:
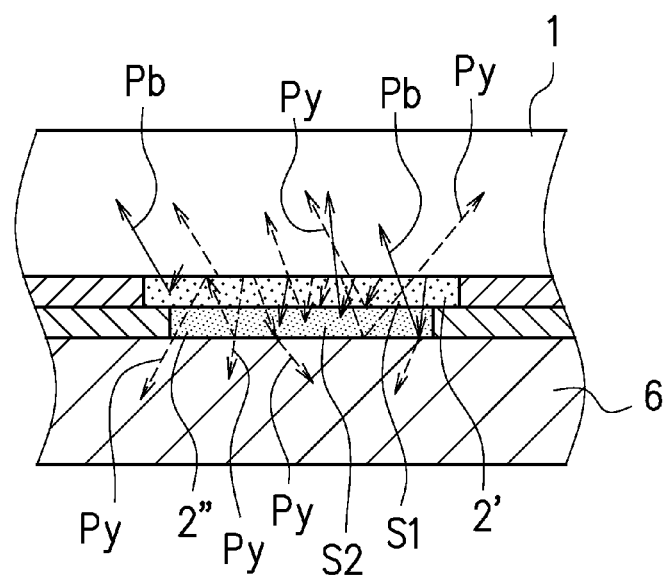
FIG. 16 is an enlarged sectional view of a portion where the light-emitting element is mounted on a substrate in FIG. 14. It shows that light toward the circuit substrate 6 is a longer wavelength light py converted by the phosphor particle 10.

FIG. 14 is a cross-sectional view of lighting device 400 according to a fourth embodiment. FIG. 15 shows a top plan view of a circuit substrate 6 used in an embodiment of the lighting device 400 according to the fourth embodiment. FIG. 16 is an enlarged sectional view of a portion where the light-emitting element is mounted on a circuit substrate in FIG. 14. It shows that light toward the circuit substrate 6 is a longer wavelength light py converted by the phosphor particle 10.

In this embodiment, the second phosphor layer 2" includes a higher density of the phosphor particle 10 than the first phosphor layer 2' on a position of the first surface 1b in a space S1 between the p-contact 3a and the n-contact 3b of the light-emitting element 1. Also, it is possible that the second phosphor layer 2" including the higher density of the phosphor particle 10 than the first phosphor layer 2 may be separately arranged at positions directly under each of the light-emitting elements 1 in the space S2 between the anode electrode 5a and the cathode electrode 5b on the upper surface of the circuit substrate 6. The position directly under the light-emitting element 1 of the circuit substrate 6 is susceptible to direct light from the light-emitting element 1, because the positions of the first surface 1b of the light-emitting element 1 closely faces the upper surface of the circuit substrate 6. The anode electrode 5a and the cathode electrode 5b are required to have a thickness greater than a maximum particle diameter of the phosphor particle 10 included in the second phosphor layer 2". Accordingly, it is possible to arrange the phosphor particle 10 between the anode electrode 5a and the cathode electrode 5b sufficiently such that direct light from the light-emitting element 1 is able to be converted by the phosphor particle 10 to be longer wavelength light, which less affects the circuit substrate.

FIG. 16 shows an explanatory diagram, showing different color components of light in a cross-sectional view of a lighting device as an embodiment, when current is passed through the lighting device. The light-emitting element 1 is configured to emit a first emission of light pb with a first emission spectrum range when current is applied to the light-emitting element 1, and the phosphor particle 10 is configured to emit a second emission of light py in response to the first emission, and the second emission of light py is longer wavelength emission than the first emission.

For more details, the first emission of light Pb is light emitted from a light-emitting element 1. Light Py is light emitted from a phosphor particle 10 that is excited by light Pb from the light-emitting element 1. Light Pw is mixed light detected by the human eye. For example, if the light-emitting element 1 is a near ultraviolet light-emitting element and the phosphor particle 10 may include a red phosphor, a green phosphor and a blue phosphor, the first emission of light Pb emitted from the light-emitting element 1 and RGB light Py from the phosphor particle 10 appear to be white light in the human eye.

Figure 17:
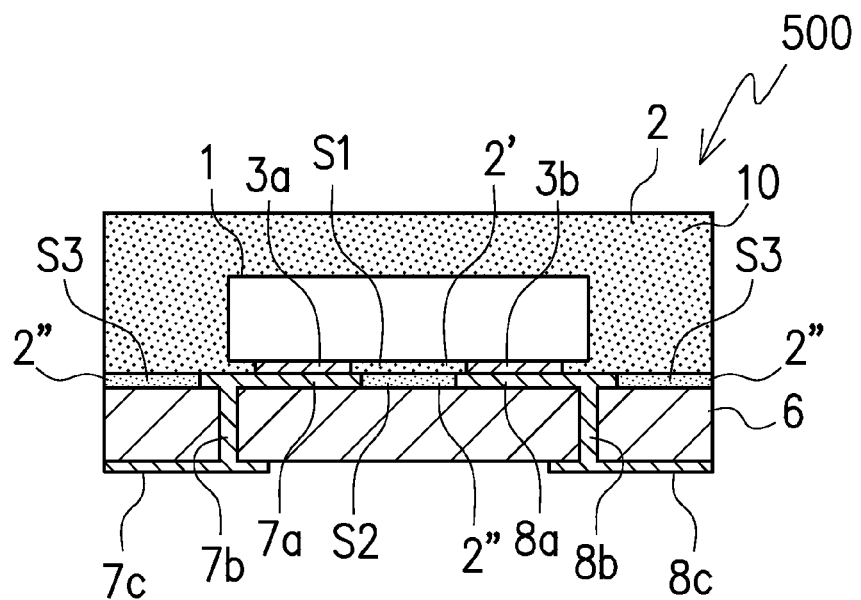
FIG. 17 is a cross-sectional view of lighting device according to a fifth embodiment.

FIG. 17 is a cross-sectional view of lighting device 500 according to a fifth embodiment.

Figure 18:
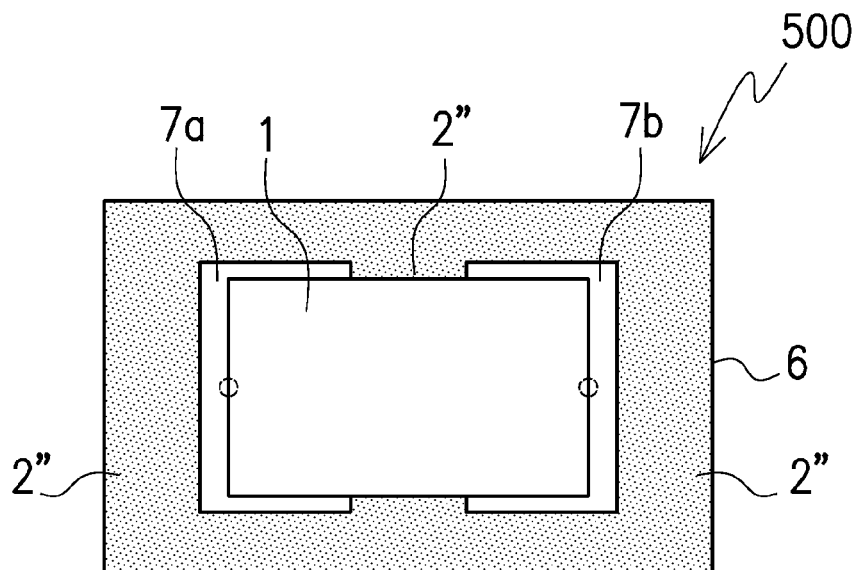
FIG. 18 shows an explanatory top plan view of lighting device with phosphor layer including a phosphor being removed from the lighting device shown in FIG. 17, for reference.

FIG. 18 shows an explanatory top plan view of lighting device 500 with phosphor layer including a phosphor being removed from the lighting device shown in FIG. 17, for reference.

Figure 19:
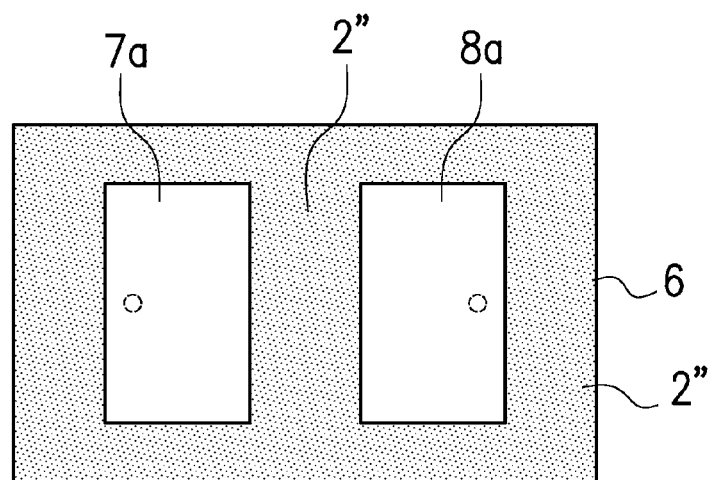
FIG. 19 shows a top plan view of a substrate used in an embodiment of a lighting device according to the fifth embodiment.

FIG. 19 shows a top plan view of a circuit substrate used in an embodiment of a lighting device according to the fifth embodiment. The second phosphor layer 2" is entirely arranged on the upper surface of the circuit substrate 6 except the anode electrode 5a and the cathode electrode 5b.

Figure 20:
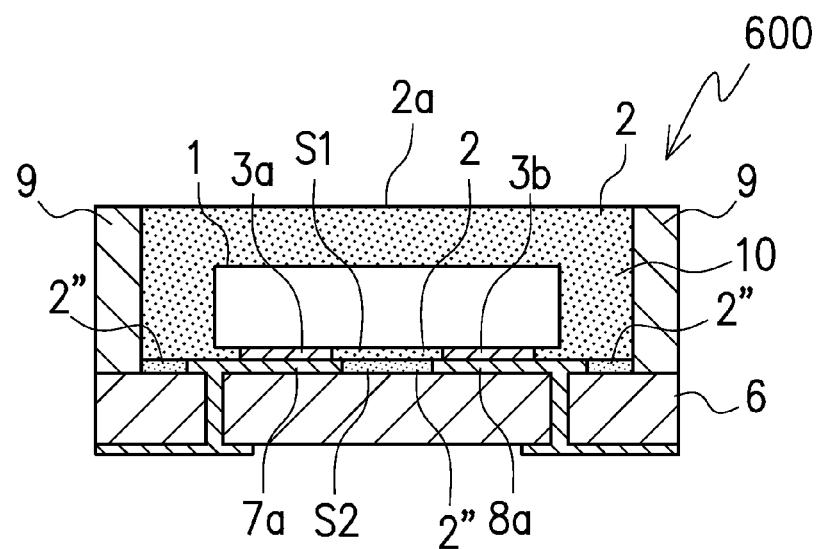
FIG. 20 is a cross-sectional view of lighting device according to a sixth embodiment.
Figure 21:
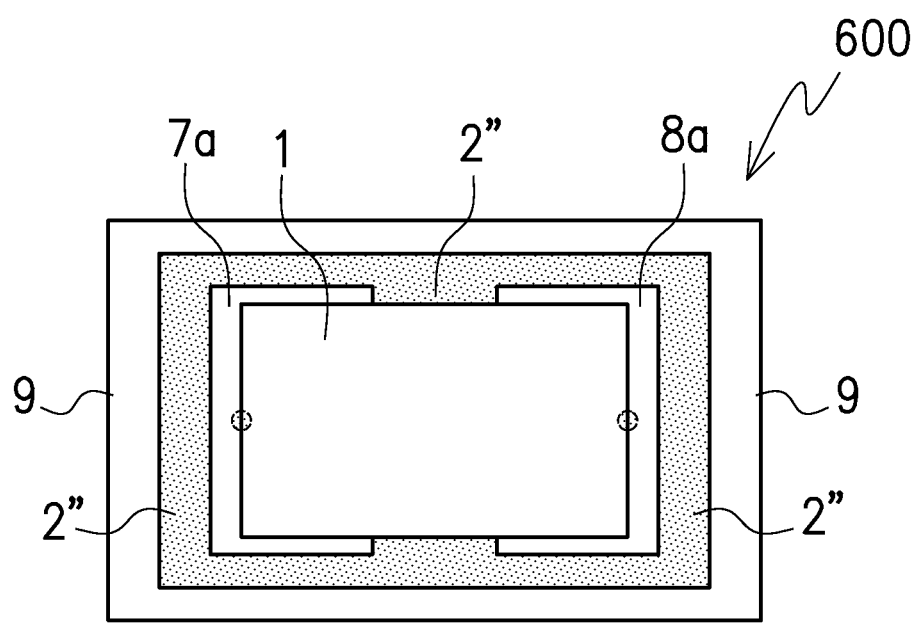
FIG. 21 shows an explanatory top plan view of lighting device with first phosphor layer being removed from the lighting device shown in FIG. 18, for reference.

FIG. 20 is a cross-sectional view of lighting device according to a sixth embodiment. FIG. 21 shows an explanatory top plan view of lighting device with first phosphor layer being removed from the lighting device shown in FIG. 18, for reference. A lighting device 600 includes a circuit substrate 6 that includes an anode electrode 7 and a cathode electrode 8 that are separately arranged from each other on the circuit substrate 5 with a space between the anode electrode 7 and the cathode electrode 8. The lighting device 600 further includes a light-emitting element 1 with a p-contact (anode) 3a and n-contact (cathode) 3b that are separately arranged from each other on a first surface 1b of the light-emitting element 1, and the light-emitting element 1 is electrically mounted on the anode electrode 5a and the cathode electrode 5b of the circuit substrate 6; and a first phosphor layer 2 including a phosphor particle 10 and being arranged over the upper surface of the circuit substrate 6 to seal the light-emitting element 1 that is electrically mounted on the anode electrode and the cathode electrode of the circuit substrate 6; and a second phosphor layer 2" including the phosphor particle 10 and filled in the space S2 between the anode electrode 7a and the cathode electrode 8a of the circuit substrate 6. In this embodiment, the lighting device 600 further includes a reflector arranged on the upper surface of the substrate 6 in contact with a peripheral side surface 2c of the first phosphor layer 2 to surround the light-emitting element 1. The second phosphor layer 2" may include a higher density of the phosphor particle 10 than the first phosphor layer 2 on a position of the first surface 1b between the p-contact 3a and the n-contact 3b of the light-emitting element 1. With the reflector 9, light is efficiently directed through an upper surface 2a of the first phosphor layer 2 as an upward light.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A lighting device comprising:
a circuit substrate comprising an anode electrode and a cathode electrode that are arranged separated from each other on a surface of the circuit substrate with a space between the anode electrode and the cathode electrode;
a light-emitting device comprising a light-emitting element that comprises a p-contact and an n-contact arranged separated from each other on a first surface of the light-emitting element, and a first phosphor layer comprising phosphor particles and covering the light-emitting element except portions of the p-contact and n-contact of the light-emitting element, the first surface of the light-emitting element facing the circuit substrate and
a second phosphor layer comprising phosphor particles and arranged in the space between the anode electrode and the cathode electrode of the circuit substrate,
wherein the first phosphor layer comprises a higher density of the phosphor particles on a position of the first surface between the p-contact and the n-contact of the light-emitting element than on a position of a second surface that is a surface opposite to the first surface of the light-emitting element,
wherein an air layer is located between a lower surface of the first phosphor layer and an upper surface of the second phosphor layer of the circuit substrate, and
wherein the first surface with the first phosphor layer between the p-contact and the n-contact of the light-emitting element of the light-emitting device is electrically mounted on the anode electrode and the cathode electrode of the circuit substrate that comprises the second phosphor layer arranged between the anode electrode and the cathode electrode of the circuit substrate.

2. The lighting device according to claim 1, wherein the second phosphor layer that is arranged on the circuit substrate and located under the first surface of the light-emitting element comprises a higher density of the phosphor particles than the first phosphor layer on the position of the second surface that is the opposite surface of the first surface of the light-emitting element.

3. The lighting device according to claim 1, wherein the second phosphor layer is arranged on an entirety of the surface of the circuit substrate except portions of the anode electrode and the cathode electrode.

4. The lighting device according to claim 1, wherein the p-contact of the light-emitting element and the anode electrode of the circuit substrate are electrically connected through an electrically conductive paste that is arranged between the p-contact and the anode electrode, and
wherein the n-contact of the light-emitting element and the cathode electrode of the circuit substrate are electrically connected through an electrically conductive paste that is arranged between the n-contact and the cathode electrode.

5. A lighting device comprising:
a circuit substrate comprising an anode electrode and a cathode electrode that are arranged separated from each other on a surface of the circuit substrate with a space between the anode electrode and the cathode electrode;
a light-emitting device comprising a light-emitting element comprising a p-contact and an n-contact that are arranged separated from each other on a first surface of the light-emitting element, and a first phosphor layer comprising phosphor particles and covering the light-emitting element except portions of the p-contact and n-contact on the first surface of the light-emitting element, the first surface of the light-emitting element facing the circuit substrate; and
a second phosphor layer comprising phosphor particles and arranged in the space between the anode electrode and the cathode electrode of the circuit substrate,
wherein the first surface with the p-contact and the n-contact of the light-emitting element of the light-emitting device is electrically mounted on the anode electrode and the cathode electrode of the circuit substrate,
wherein the light-emitting element comprises at least one light-emitting element that belongs to a light emission spectrum range of 400 nm to 490 nm, and
wherein an air layer is located between a lower surface of the first phosphor layer and an upper surface of the second phosphor layer of the circuit substrate.

6. The lighting device according to claim 5, wherein the phosphor particles of the first phosphor layer and the phosphor particles of the second phosphor layer have a same density.

7. The lighting device according to claim 5, wherein the phosphor particles of the second phosphor layer have a higher density than the phosphor particles of the first phosphor layer.

8. The lighting device according to claim 5, wherein the phosphor particles comprise YAG (yttrium aluminum garnet) phosphor particles.

9. The lighting device according to claim 5, wherein the phosphor particles comprise red phosphor particles.

10. The lighting device according to claim 5, wherein a plurality of the light-emitting devices are arranged over the circuit substrate in a line.

11. A lighting device comprising:
a circuit substrate comprising an anode electrode and a cathode electrode that are arranged separated from each other on an upper surface of the circuit substrate with a space between the anode electrode and the cathode electrode;
a light-emitting element comprising a p-contact and an n-contact that are arranged separated from each other on a first surface of the light-emitting element, the p-contact and the n-contact on the first surface of the light-emitting element being electrically mounted on the anode electrode and the cathode electrode of the circuit substrate, and the first surface of the light-emitting element facing the circuit substrate;
a first phosphor layer comprising phosphor particles and being arranged over the upper surface of the circuit substrate to seal the light-emitting element that is electrically mounted on the anode electrode and the cathode electrode of the circuit substrate; and
a second phosphor layer comprising phosphor particles and filled in the space between the anode electrode and the cathode electrode of the circuit substrate, wherein the light-emitting element comprises at least one blue light-emitting element, at least one near ultraviolet light-emitting element, and/or at least one ultraviolet light-emitting element, wherein the phosphor particles of the second phosphor layer have a higher density than the phosphor particles of the first phosphor layer on a position of the first surface between the p-contact and the n-contact of the light-emitting element, and wherein the anode electrode and the cathode electrode have a thickness greater than a maximum particle diameter of the phosphor particles of the second phosphor layer.

12. The lighting device according to claim 11,
wherein a plurality of the light-emitting elements are arranged over the upper surface of the circuit substrate.

13. The lighting device according to claim 11,
wherein the light-emitting element is configured to emit a first emission of light with a first emission spectrum range when current is applied to the light-emitting element, the phosphor particles are configured to emit a second emission of light in response to the first emission, and the second emission is longer wavelength emission than the first emission.

* * * * *